(12) United States Patent
Smakman et al.

(10) Patent No.: US 12,744,181 B2
(45) Date of Patent: Sep. 22, 2026

(54) ELECTRON BEAM APPARATUS, INSPECTION TOOL AND INSPECTION METHOD

(71) Applicant: ASML NETHERLANDS B.V., Veldhoven (NL)

(72) Inventors: Erwin Paul Smakman, Eindhoven (NL); Albertus Victor Gerardus Mangnus, Eindhoven (NL); Maikel Robert Goosen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 777 days.

(21) Appl. No.: 17/054,559

(22) PCT Filed: May 24, 2019

(86) PCT No.: PCT/EP2019/063460
§ 371 (c)(1),
(2) Date: Nov. 11, 2020

(87) PCT Pub. No.: WO2019/228922
PCT Pub. Date: Dec. 5, 2019

(65) Prior Publication Data

US 2021/0249224 A1 Aug. 12, 2021

(30) Foreign Application Priority Data

May 28, 2018 (EP) .................................... 18174621

(51) Int. Cl.
*H01J 37/244* (2006.01)
*H01J 37/04* (2006.01)
(Continued)

(52) U.S. Cl.
CPC ........ *H01J 37/3177* (2013.01); *H01J 37/045* (2013.01); *H01J 37/1474* (2013.01);
(Continued)

(58) Field of Classification Search
CPC ........ H01J 37/045; H01J 37/20; H01J 37/244; H01J 37/1474; H01J 37/3177; H01J 2237/0437; H01J 2237/24592
See application file for complete search history.

(56) References Cited

U.S. PATENT DOCUMENTS

| | | | | |
|---|---|---|---|---|
| 8,110,813 B2 | 2/2012 | Baars et al. | | |
| 8,134,135 B2 * | 3/2012 | Kruit | H01J 37/12 | 250/492.24 |

(Continued)

FOREIGN PATENT DOCUMENTS

| | | |
|---|---|---|
| CN | 103650097 | 3/2014 |
| EP | 2190003 | 5/2010 |

(Continued)

OTHER PUBLICATIONS

International Search Report and Written Opinion issued in corresponding PCT Patent Application No. PCT/EP2019/063460, dated Aug. 27, 2019.

(Continued)

*Primary Examiner* — Sean Luck
(74) *Attorney, Agent, or Firm* — Pillsbury Winthrop Shaw Pittman, LLP

(57) ABSTRACT

An electron beam apparatus including: an electron beam source configured to generate an electron beam; a beam conversion unit including an aperture array configured to generate a plurality of beamlets from the electron beam, and a deflector unit configured to deflect one or more groups of the plurality of beamlets; and a projection system configured to project the plurality of beamlets onto an object, wherein the deflector unit is configured to deflect the one or more groups of the plurality of beamlets to impinge on the object
(Continued)

at different angles of incidence, each beamlet in a group having substantially the same angle of incidence on the object.

20 Claims, 16 Drawing Sheets

(51) Int. Cl.
*H01J 37/147* (2006.01)
*H01J 37/20* (2006.01)
*H01J 37/317* (2006.01)

(52) U.S. Cl.
CPC ............ *H01J 37/20* (2013.01); *H01J 37/244* (2013.01); *H01J 2237/0437* (2013.01); *H01J 2237/24592* (2013.01)

(56) References Cited

U.S. PATENT DOCUMENTS 8,618,496 B2 * 12/2013 Wieland ................. B82Y 40/00 250/397
9,035,249 B1 5/2015 Frosien et al.
9,507,629 B2 11/2016 Van Kervinck et al.
9,607,805 B2 3/2017 Liu et al.
9,607,806 B2 3/2017 Kruit et al.
2005/0072941 A1 * 4/2005 Tanimoto ............... B82Y 40/00 250/492.23
2011/0253893 A1 * 10/2011 Banzhof ............... H01J 37/153 250/307
2012/0091318 A1 4/2012 Wieland et al.
2012/0295202 A1 * 11/2012 Sano .................. H01J 37/3007 430/296
2013/0252145 A1 * 9/2013 Matsumoto ........... G03F 7/2059 250/397
2014/0367586 A1 * 12/2014 Frosien ................. H01J 37/153 250/397
2016/0111246 A1 * 4/2016 Matsumoto ......... H01J 37/3177 250/396 R
2017/0213688 A1 7/2017 Ren et al.

FOREIGN PATENT DOCUMENTS

EP 2503587 9/2012
EP 2579268 4/2013
EP 2579269 4/2013
EP 2816585 12/2014
TW 201103066 1/2011
TW 201250757 12/2012
TW 201729233 8/2017
WO 2016145458 9/2016

OTHER PUBLICATIONS

Taiwanese Office Action issued in corresponding Taiwanese Patent Application No. 108118360, dated Dec. 3, 2020.
Office Action issued in corresponding Chinese Patent Application No. 201980035698.1, dated Feb. 6, 2024.

* cited by examiner

PRIOR ART

ELECTRON BEAM APPARATUS, INSPECTION TOOL AND INSPECTION METHOD

CROSS-REFERENCE TO RELATED APPLICATIONS

This application is the U.S. national phase entry of PCT Patent Application No. PCT/EP2019/063460, which was filed on May 24, 2019, which claims the benefit of priority of European Patent Application No. 18174621.5, which was filed on May 28, 2018, and which is incorporated herein in its entirety by reference.

BACKGROUND

Field of the Invention

The present invention relates to an electron beam apparatus, an inspection tool, an inspection method and a exposure apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g. having a wavelength of 11 nm or 13.5 nm).

The patterning of a substrate may also be accomplished using an electron beam or multiple electron beams. Such technology is generally referred to as electron beam lithography.

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as e-beam inspection tools. Such tools may e.g. be applied to assess whether or not certain process steps, as. e.g. performed by a lithographic apparatus, are executed as expected.

It would be desirable to improve the performance of electron beam lithographical apparatuses and e-beam inspection tools such as currently available.

SUMMARY

It is desirable to improve the performance of e-beam inspection tools or exposure apparatuses. In order to address these concerns, according to an aspect of the present invention, there is provided an electron beam apparatus comprising:

- an electron beam source configured to generate an electron beam;
- a beam conversion unit comprising:
  - an aperture array configured to generate a plurality of beamlets from the electron beam;
  - a deflector unit configured to deflect one or more of the plurality of beamlets;
- a projection system configured to project the plurality of beamlets onto an object,
- wherein the deflector unit is configured to deflect the one or more of the plurality of beamlets to impinge on the object at different angles of incidence.

According to another aspect of the present invention, there is provided a method of inspecting an object, the method comprising:

- generating a plurality of beamlets from an electron beam source, the beamlets being configured to impinge the object at different angles of incidence;
- detecting a response signal from the object in response to the impinging of the object with the plurality of beamlets;
- processing the response signal to determine a characteristic of the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
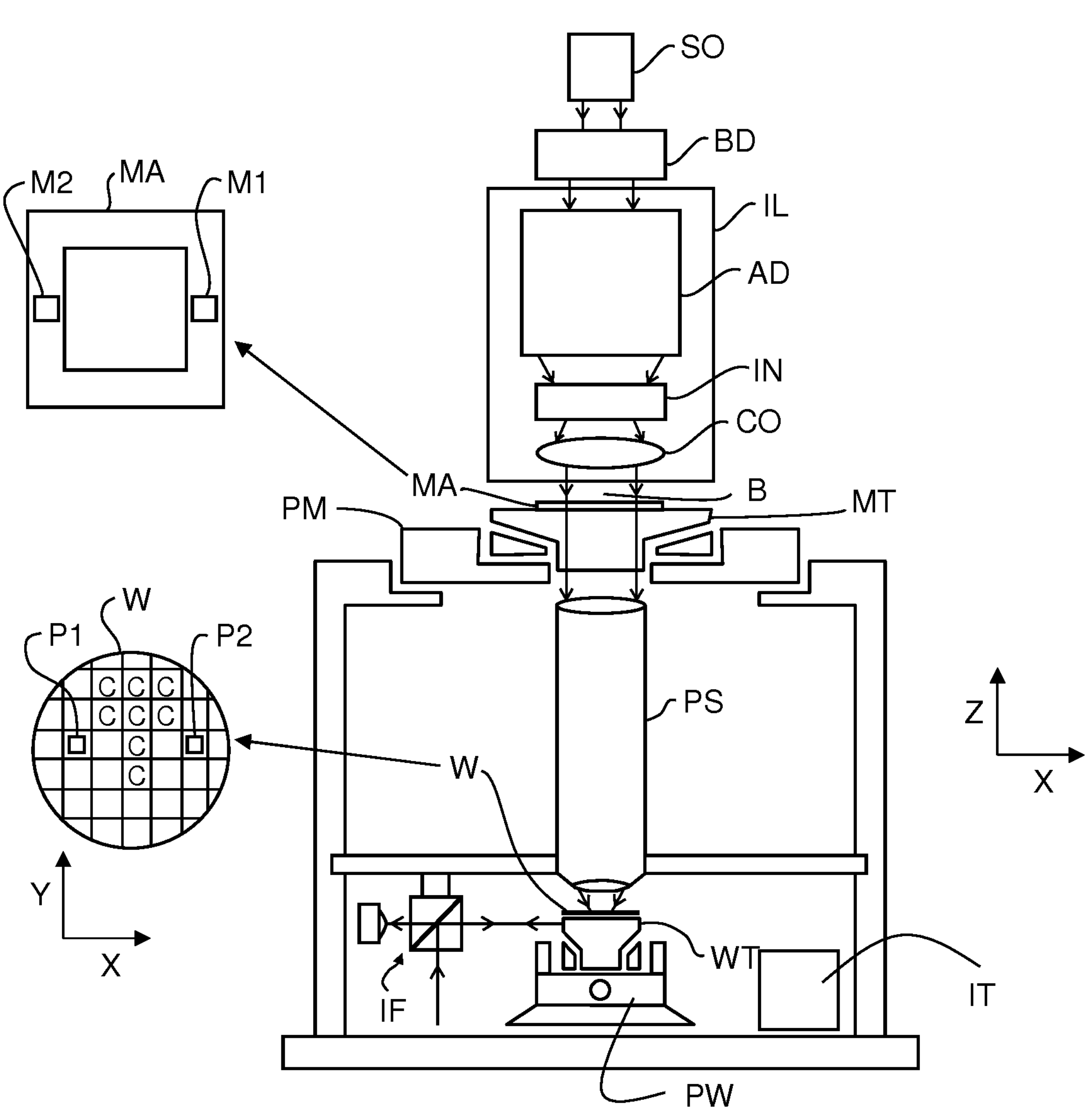
FIG. 1A depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation such as e-beam radiation or EUV radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the embodiment as shown, the lithographic apparatus further comprises an inspection tool IT according to the invention. Such an inspection tool IT may e.g. enable to determine a characteristic of a structure that is present on or in an area of interest of a substrate W that is processed by the lithographic apparatus. In an embodiment, as will be discussed in more detail below, the inspection tool may comprise an electron beam source for inspecting the substrate. In an embodiment, the second positioning device PW may be configured to position the substrate W in the operating range of the inspection tool IT. In such an embodiment, the inspection tool IT may e.g. be configured to determine a characteristic of the mentioned structure, e.g. an electric characteristic, a material characteristic and/or a geometric characteristic. In an embodiment, this information may subsequently be provided to a control unit of the lithographic apparatus and used during the exposure process, e.g. by controlling one or more of the illumination system, the projection system or one of the positioning devices, based on the information.

In the embodiment as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to the present invention may be configured to apply EUV radiation for the radiation beam. In such case, the patterning device MA may be a reflective patterning device and the projection system PS may comprise one or more mirrors. In such embodiment, the apparatus may comprise one or more vacuum chambers for housing the illumination system IL and/or the projection system PS.

Alternatively, the lithographic apparatus may be configured to apply an electron beam as the radiation beam to pattern the substrate W. Such a lithographic apparatus may e.g. comprise an electron beam apparatus according to the invention for patterning the substrate W. In an embodiment of such an apparatus, as will be explained in more detail below, a charged particle beam, in particular an electron beam, is converted to a plurality of beamlets that can be steered towards the substrate W, in order to expose desired portions of the substrate W. In accordance with the present invention, the charged particle beam lithographic apparatus comprises a deflector unit which is configured to the plurality of beamlets in such manner that they impinge on the surface of the substrate W at different angles of incidence.

Figure 1B:
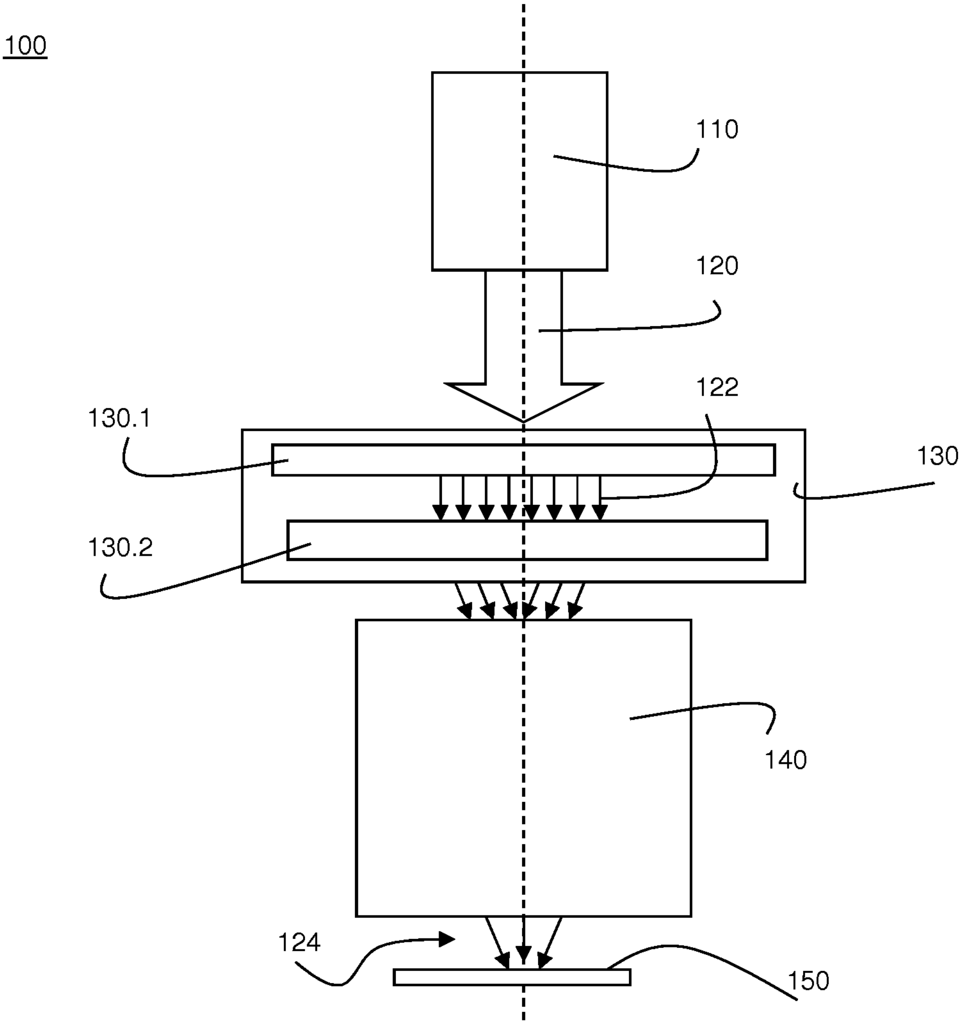
FIG. 1B depicts an electron beam apparatus according to an embodiment of the invention.

According to an aspect of the present invention, there is provided an electron beam apparatus. An embodiment of such an electron beam apparatus is schematically shown in FIG. 1B. FIG. 1B schematically shows an electron beam apparatus 100 according to the present invention, the apparatus comprising an electron beam source 110 for generating an electron beam, e.g. a collimated electron beam 120.

In an embodiment, the electron beam source may be configured to generate an expanding electron beam. Such an expanding electron beam may be collimated by a collimator lens or collimator lens system of the electron beam source to generate a collimated electron beam 120. In the embodiment as shown, the electron beam 120 is provided to a beam conversion unit 130 that is configured to convert the electron beam 120. In particular, in the embodiment as shown, the beam conversion unit 130 comprises an aperture array 130.1 and a deflector unit 130.2. In accordance with the present invention, the aperture array 130.1 is configured to generate a plurality of beamlets 122 from the electron beam 120. In an embodiment of the present invention, such an aperture array 130.1 may comprises a perforated plate, e.g. comprising a two-dimensional array of perforations, each perforation providing an aperture that creates one beamlet.

In an embodiment of the present invention, the aperture array 130.1 may comprise a cascaded arrangement of two or more aperture arrays. In such an arrangement, the aperture array 130.1 may e.g. comprise a first aperture array which blocks part of the electron beam for creating a plurality of sub-beams. In such an arrangement, the aperture array may comprise a lens array for focusing the sub-beams and a second aperture array which creates a plurality of beamlets from each sub-beam.

In accordance with the present invention, the beam conversion unit 130 comprises a deflector unit 130.2 that is configured to deflect one or more beamlets of the plurality of beamlets 122 that are created. As will be explained in more detail below, various options exist to realize such a deflector unit 130.2. Although shown as separate components in FIG. 1B, it can be noted that the aperture array 130.1 and the deflector unit 130.2 may be integrated into a single unit having both the functionality of creating the plurality of beamlets and deflecting one or more of the beamlets.

In an embodiment, the beam conversion unit may further include a focusing functionality, e.g. enabling the beamlets to be focused. Such focusing may be realized for each beamlet individually or for a group of multiple beamlets.

In the embodiment as shown, the electron beam apparatus 100 according to the present invention further comprises a projection system 140 that is configured to project the plurality of beamlets onto an object 150, e.g. a substrate such as a semiconductor substrate. In an embodiment, the projection system 140 can e.g. comprise an objective lens for focusing the beamlets onto the surface of the object 150.

In an embodiment, the projection system 140 may further comprise a scanning deflector lens or system for scanning the plurality of beamlets across the surface of the object.

In accordance with the present invention, the deflector unit 130.2 of the electron beam apparatus 100 is configured to deflect the plurality of beamlets 122, or one or more of said beamlets 122 is such manner that the plurality of beamlets impinge on the object at different angles of incidence. This is schematically shown by reference number 124 in FIG. 1B.

The electron beam apparatus according to the present invention may be applied for various, different purposes.

In an embodiment of the present invention, the electron beam apparatus according to the present invention is applied in an inspection tool, e.g. an inspection tool for inspecting samples or substrates, e.g. semiconductor substrates. As such, in an embodiment of the present invention, there is provided an inspection tool comprising an electron beam apparatus according to the present invention. It can be acknowledged that inspection tools that use an electron beam source are generally known. Examples of such tools e.g. include SEMs, scanning electron microscopes.

Figure 2A:
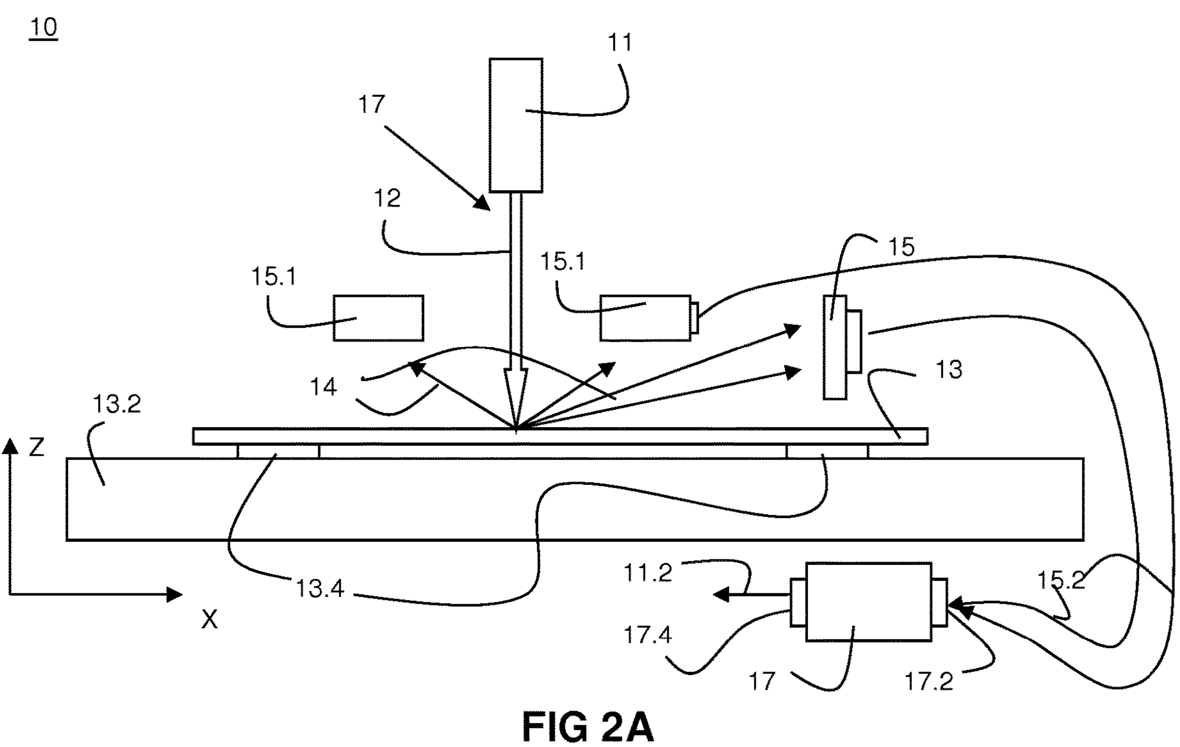
FIG. 2A depicts an inspection tool as known in the art.

Such an electron beam based inspection tool 10 as generally known is schematically shown in FIG. 2A. The inspection tool 10 as shown comprises an electron beam source 11, further on also referred to as an e-beam source 11.

Such an e-beam source 11 is known in general, and may be configured to project an electron beam 12 onto an area of an object 13, e.g. a substrate. In the embodiment as shown, the object 13 is mounted to an object table 13.2 by means of a mounting mechanism 13.4, e.g. fixing mechanism such as a screw or a clamping mechanism, e.g. a vacuum clamp or an electrostatic clamp. The area of the object onto which the e-beam is projected may also be referred to as sample. Such an e-beam source 11 may e.g. be used to generate an electron beam 12 having an energy ranging from less than 0.2 keV to 100 keV. An e-beam source 11 may typically have one or more lenses for focusing the electron beam 12 onto a spot of about 0.4 to 5 nm in diameter. In an embodiment, the e-beam source 11 may further comprise one or more scanning coils or deflector plates which may deflect the electron beam 12. By doing so, the electron beam 12 may e.g. be deflected along an X-axis and an Y-axis (perpendicular to the X-axis and the Z-axis), the XY-plane being parallel to a surface of the object, such that an area of the object can be scanned.

When such an e-beam 12 impinges on the surface, interactions on the surface and interactions with the material below the surface will occur, resulting in the exposed surface emitting both radiation and electrons. Typically, when an electron beam 12 interacts with a sample, the electrons constituting the beam will loose energy through scattering and absorption, within a teardrop-shaped volume, known as the interaction volume. The energy exchange between the electron beam and the sample will typically result in a combination of:

- an emission of secondary electrons by inelastic scattering,
- an emission of electrons that are reflected or back-scattered out of the interaction volume by elastic scattering interactions with the sample,
- X-ray emission, and
- an emission of electromagnetic radiation, e.g. in a range from deep UV to IR.

The latter emission of electromagnetic radiation is generally referred to as cathodoluminescent light or CL-light.

Typically, the inspection tool 10 further comprises a detector 15 and a detector 15.1 which may both be used the detection of secondary electrons and back-scattering electrons. In an embodiment, detector 15 is used for detection of secondary electrons while detector 15.1 is used for the detection of back-scattering electrons as emitted by a sample. In FIG. 2, the arrows 14 are indicative for the emitted secondary or back-scattering electrons.

In the arrangement as shown, the inspection tool further comprises a control unit 17 or processing unit, e.g. comprising a microprocessor, computer or the like, for processing the emitted secondary or back-scattering electrons as detected by the detectors 15 and 15.1.

In the arrangement as shown, the control unit 17 comprises an input terminal 17.2 for receiving signals 15.2 from the detectors 15, 15.1, the signals 15.2 representing the detected emitted secondary or back-scattering electrons.

In the arrangement as shown, the control unit may further have an output terminal 17.4 for outputting a control signal 11.2 for controlling the e-beam source 11. In an embodiment, the control unit 17 may control the e-beam source 11 to project an e-beam 12 onto an area of interest of the object to be inspected, e.g. a semiconductor substrate.

In an embodiment, the control unit 17 may be configured to control the e-beam source 11 to scan the area of interest.

In known electron beam inspections tools, the electron beam 12 will typically impinge the object 13 or the surface of the object at a predefined angle. The electron beam 12 may e.g. land on the surface at a 90 degrees angle, i.e. perpendicular to the surface.

It is further known to use multiple electron beams for inspecting an object such as a semiconductor substrate. In such an arrangement, multiple electron beams are configured to impinge at different locations on an area of interest, thus enabling the scanning or probing of these different locations at the same time. In known arrangements of such multi-beam inspection tools, the multiple electron beams are configured to impinge the surface of the object at the same angle.

In accordance with an embodiment of the present invention, an electron beam apparatus is provided that is configured to provide in a plurality of beamlets for impinging a surface of an object, whereby the plurality of beamlets are configured to impinge on the object or the surface of the object at different angles of incidence.

Figure 2B:
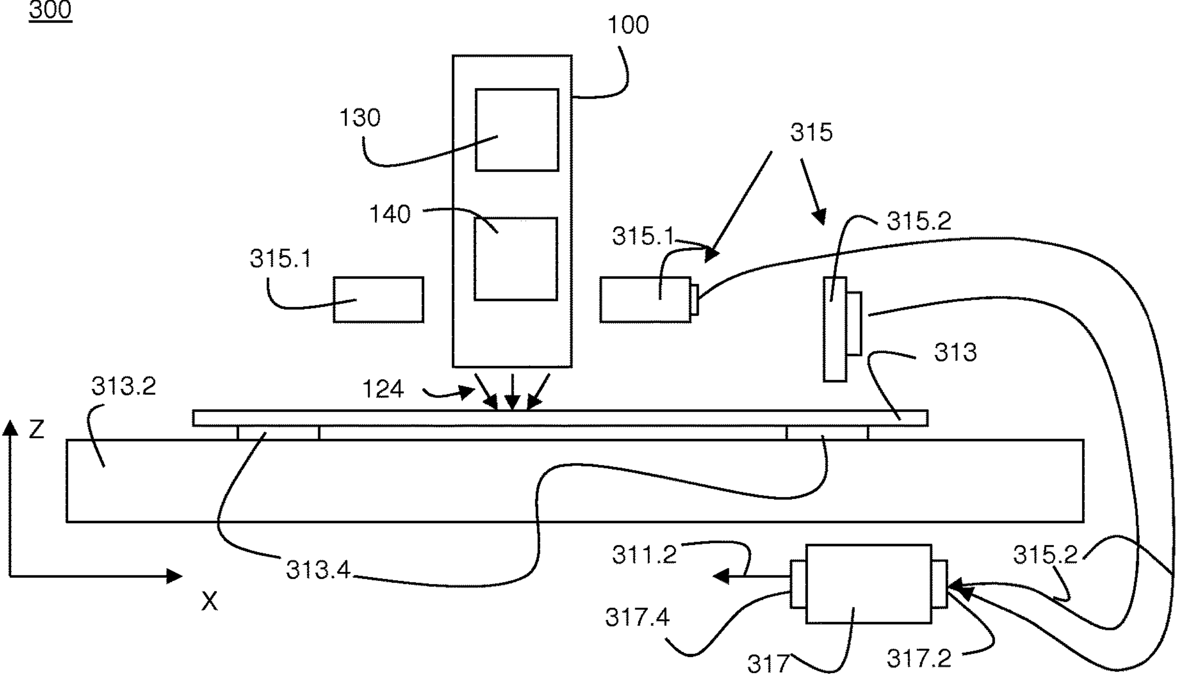
FIG. 2B depicts an inspection tool according to an embodiment of the invention.

An inspection tool according to the present invention that comprises such an electron beam apparatus according to the present invention, is schematically shown in FIG. 2B. FIG. 2B schematically shows an inspection tool 300 according to the present invention, the inspection tool 300 comprising an electron beam apparatus 100 according to the present invention for generating a plurality of beamlets 124 that are configured to impinge an object 313 at different angles of incidence. The electron beam apparatus 100 as schematically shown comprises a source conversion module 130 and a projection system 140 as discussed above. In the embodiment as shown, the object 313 is mounted to an object table 313.2 by means of a mounting mechanism 313.4, e.g. a fixing mechanism or a clamping mechanism, e.g. a vacuum clamp or an electrostatic clamp. The inspection tool 300 as schematically shown further comprises a detector 315 configured to detect electrons emitted by the object, in response to the application of the beamlets 124 to the surface of the object 313, e.g. a semiconductor substrate. Depending on the application, the detector 315 may comprise one or more detectors for detecting different types of emission that are caused by the interaction of the beamlets 124 with the object, such emissions e.g. including one or more of secondary electrons, back scattering electrons, X-ray emission or emission of electromagnetic radiation. In the embodiment as shown, the detector 315 comprises a detector 315.2 for detection of secondary electrons and a detector 315.1 for detection of back-scattering electrons as emitted by the object 313.

In an embodiment, the detector 315 as applied in the inspection tool according to the present invention may comprise a plurality of detector elements for detecting the emitted radiation caused by the interaction of the object with the plurality of beamlets 124 respectively.

In the embodiment as shown, the inspection tool further comprises a control unit 317 or processing unit, e.g. comprising a microprocessor, computer or the like, for processing the emitted secondary or back-scattering electrons as detected by the detector 315.

In the arrangement as shown, the control unit 317 comprises an input terminal 317.2 for receiving signals 315.3 from the detectors 315.1, 315.2, the signals 315.3 representing the detected emitted radiation, e.g. the secondary or back-scattering electrons.

In the arrangement as shown, the control unit may further have an output terminal 317.4 for outputting a control signal 311.2 for controlling the electron beam apparatus 100. In an embodiment, the control unit 317 may control the electron beam apparatus 100 to project the beamlets 124 onto an area of interest of the object to be inspected, e.g. a semiconductor substrate. In an embodiment, the control unit 317 may be configured to control the electron beam apparatus 100 to scan the area of interest.

Figures 3A, 3B:
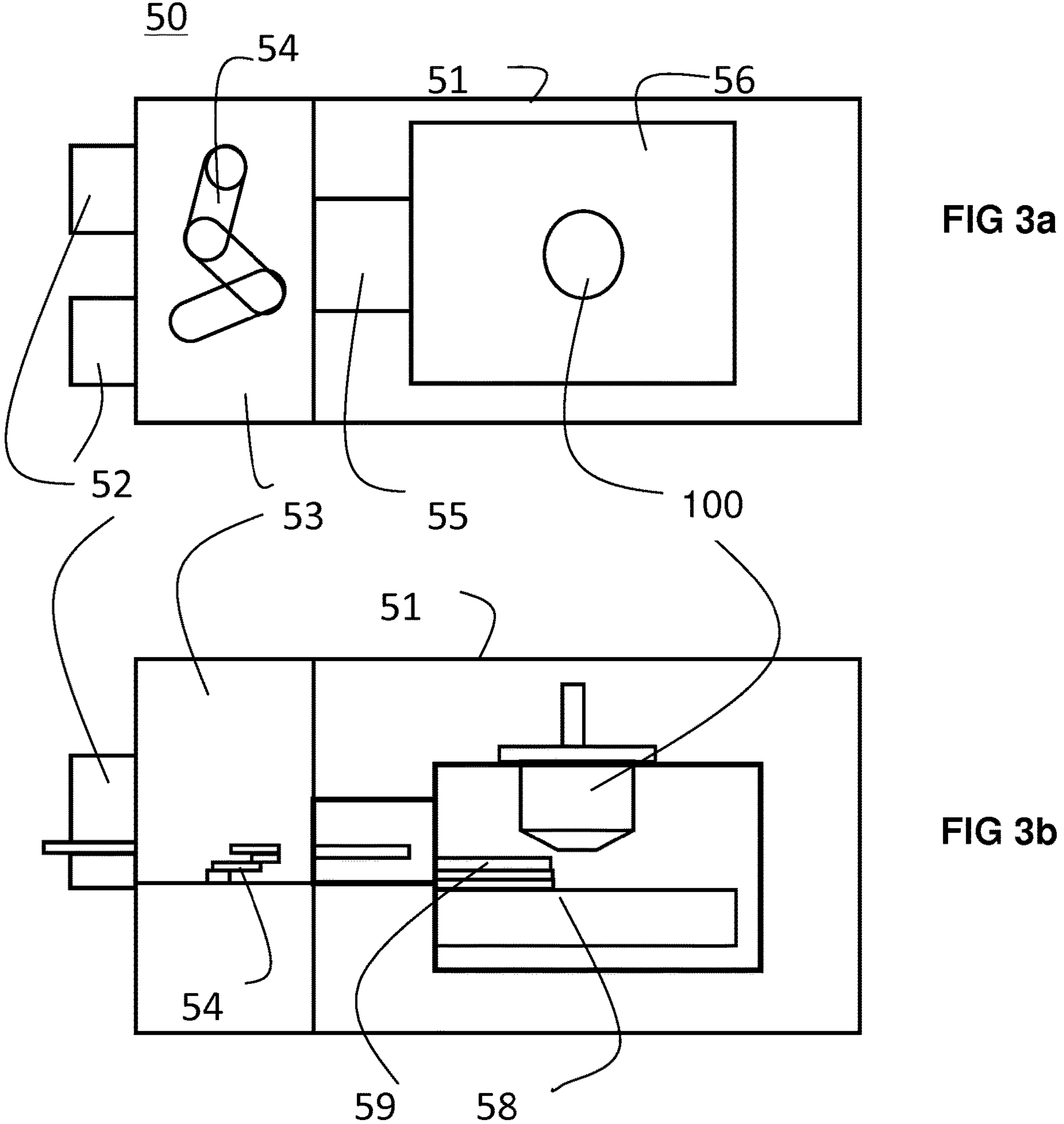
FIGS. 3*a* and 3*b* schematically depicts a top view and a side view of an inspection tool according to the present invention.

FIGS. 3A and 3B schematically depict a top view and a cross-sectional view of an inspection tool 50 according to an embodiment of the present invention. Such an inspection tool 50 may e.g. have the functionality of the inspection tool 300 as discussed above. The embodiment as shown comprises an enclosure 51, a pair of load ports 52 serving as an interface to receive objects to be examined and to output objects that have been examined. The embodiment as shown further comprises an object transfer system, referred as an EFEM, equipment front end module 53, that is configured to handle and/or transport the objects to and from the load ports. In the embodiment as shown, the EFEM 53 comprises a handler robot 54 configured to transport objects between the load ports and a load lock 55 of the inspection tool 50. The load lock 55 is an interface between atmospheric conditions occurring outside the enclosure 51 and in the EFEM and the vacuum conditions occurring in a vacuum chamber 56 of the inspection tool 50. In the embodiment as shown, the vacuum chamber 56 comprises an electron beam apparatus 100 according to the present invention, the apparatus being configured to project a plurality of beamlets onto an object to be inspected, e.g. a semiconductor substrate or wafer. The inspection tool 50 further comprises a positioning device 58 that is configured to displace the object 59 relative to the beamlets that are generated by the electron beam apparatus 100. In an embodiment, the positioning device may comprise a cascaded arrangement of multiple positioners such an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 58 further comprises an object table for holding the object during the inspection process performed by the inspection tool 50. In such embodiment, the object 59 may be clamped onto the object table by means of a clamp such as an electrostatic clamp. Such a clamp may be integrated in the object table.

Using an inspection tool according to the present invention, an inspection tool as e.g. schematically shown in FIGS. 2B, 3A and 3B, an object, e.g. a sample or semiconductor substrate can be examined by a plurality of beamlets that impinge on the object at different angles of incidence. As will be explained in more detail below, such an inspection enables to assess, in a more detailed and accurate manner, certain parameters of the object that is inspected. Inspection tools such as e-beam inspection tools are e.g. used to inspect structures on a semiconductor substrates, thereby determining particular parameters of said structures. Such parameters can e.g. include critical dimension (CD), line edge roughness (LER), line width roughness (LWR), side wall angle (SWA), overlay (OVL), etc., Based on such determined parameters, one may then evaluate the process as e.g. performed by a tool or apparatus used in the generation of the structures. As an example, the quality of an exposure process as performed by a lithographic apparatus, e.g. a lithographic apparatus as schematically shown in FIG. 1A may be assessed. As an example, the exposure process may e.g. result in the creation of a grating or grating like structure, whereby the quality of the obtained grating is assessed by determining, using an e-beam inspection tool, parameters such as CD-uniformity, LER, LWR or SWA.

In an embodiment of the present invention, there is provided an inspection method for inspecting an object, e.g. a semiconductor substrate, using a plurality of beamlets that impinge on the object at different angles of incidence.

Figure 4A:
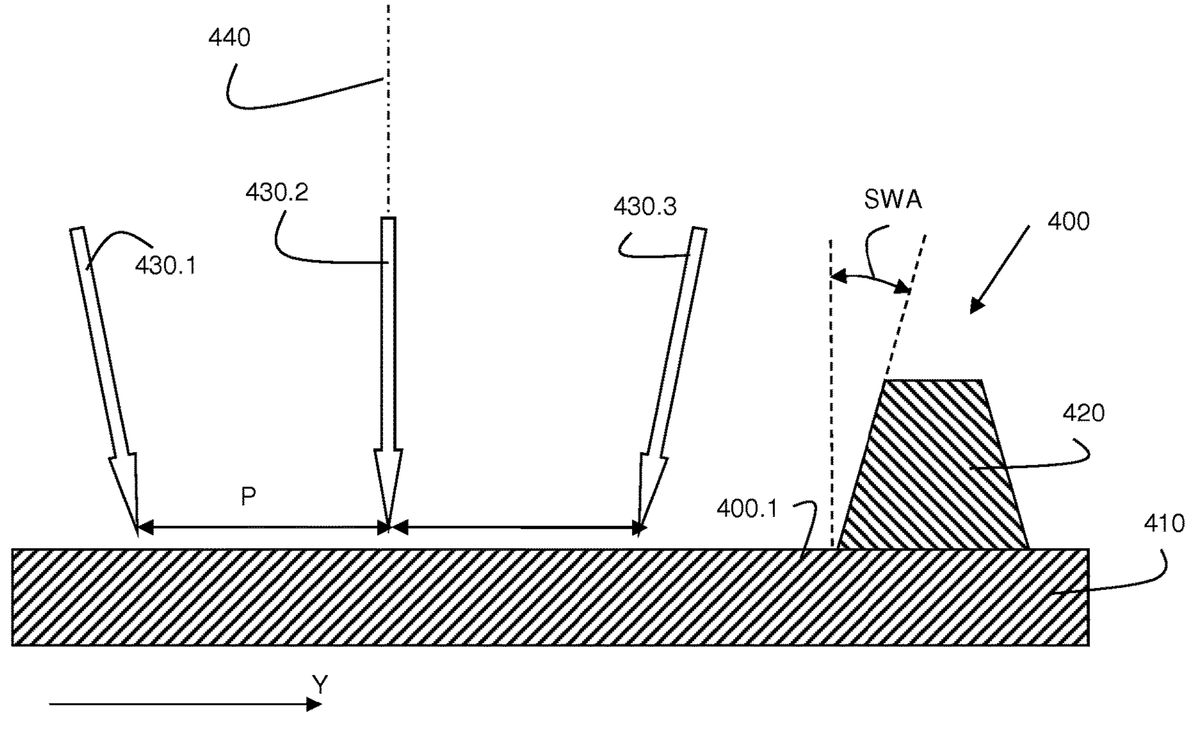
FIGS. 4A to 6B illustrate the use of the present invention for inspecting objects such as semiconductor substrates.
Figure 4B:
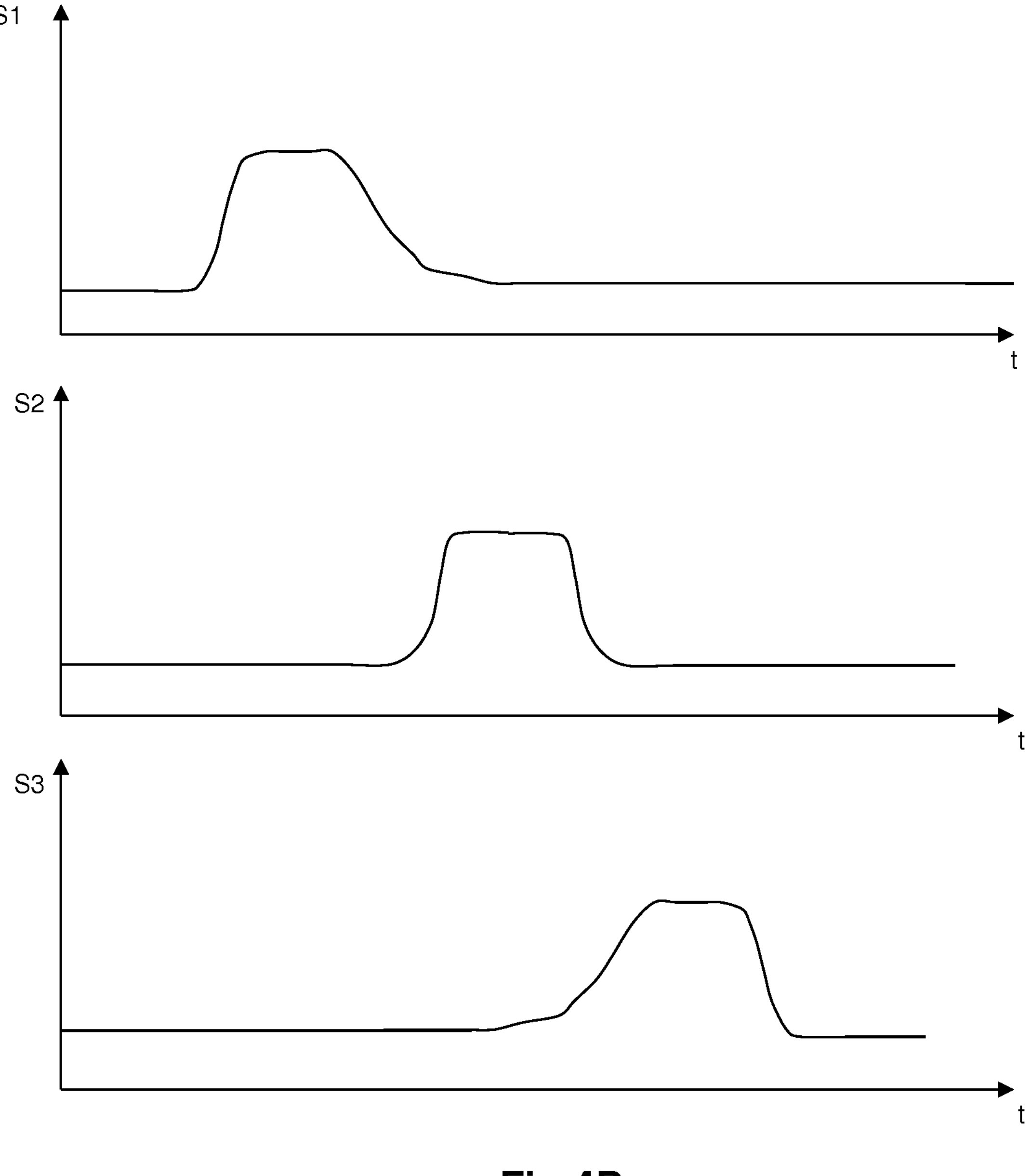

FIGS. 4A and 4B schematically illustrate such an inspection method, applied to the inspection of a side wall angle (SWA) of a structure.

Figure 5A:
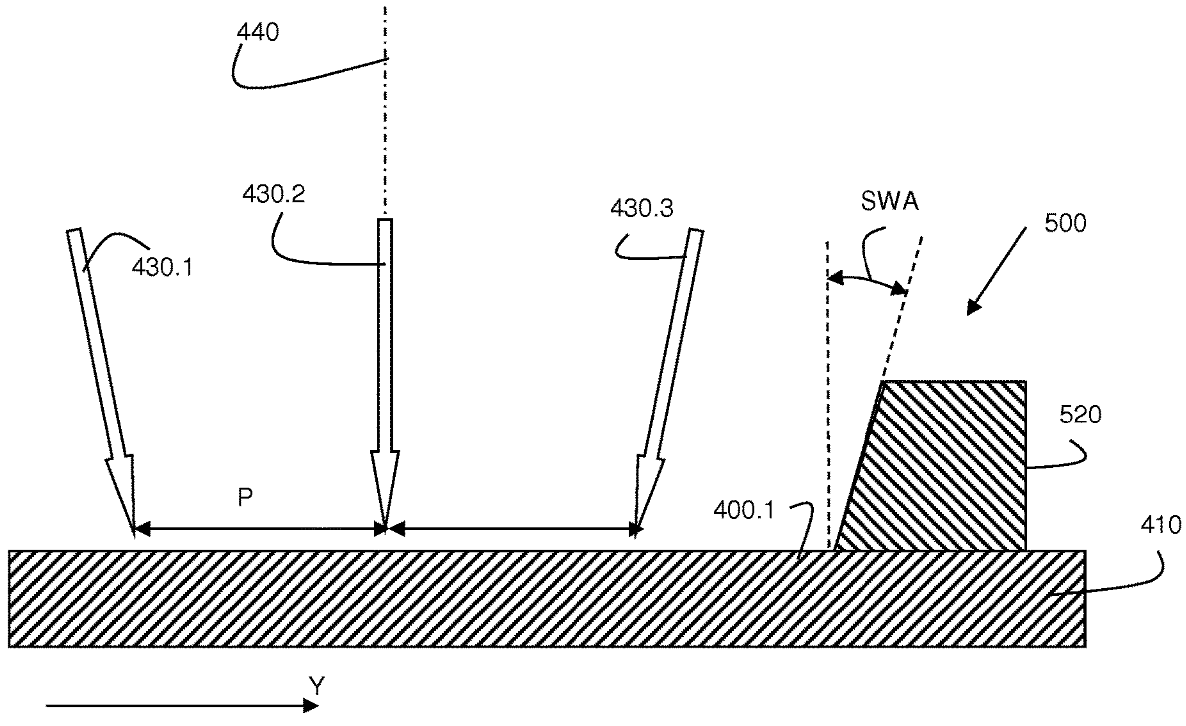
Figure 5B:
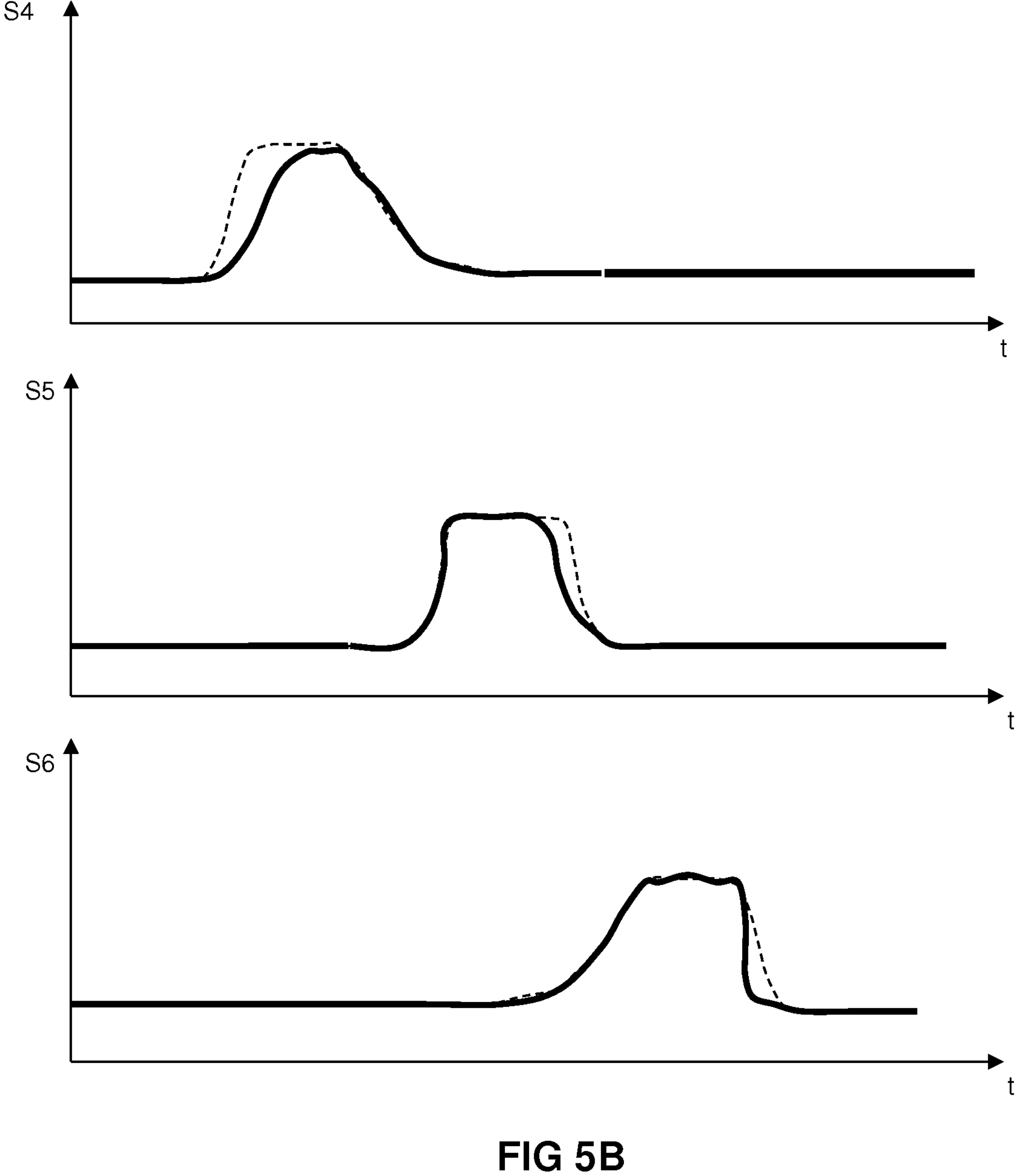

FIG. 4A schematically shows a structure 400 comprising a layer 410 and a line or line-shaped structure 420, e.g. representing a line of a grating, such a line 420 e.g. being manufactured by an exposure process, performed by a lithographic apparatus, followed by a development process. The line 420 may e.g. be made from a resist material, that is e.g. different from a material of the layer 410. The line 420 as shown has a non-zero side wall angle SWA on both sides of the line. FIG. 4A further schematically shows 3 beamlets, i.e. comparatively small electron beams, 430.1, 430.2, 430.3 that are configured to impinge the structure 400 at different angles of incidence. In the embodiment as shown, the beamlets 430.1-430.3 impinge the surface of the structure at respective angles of for example −10, 0, 10 degrees, relative to the optical axis 440, that is deemed to be perpendicular to the surface 400.1 of the structure. In the embodiment as shown, the beamlets 430.1-430.3 are spaced apart over a distance P, also referred to as the pitch between the different beamlets. It is further assumed that the structure 400 is scanned by the three beamlets by displacing the beamlets in the indicated Y-direction relative to the structure 400. FIG. 4B schematically shows simulated response signals as can be received when the structure 400 is scanned by the three beamlets 430.1-430.3 along the Y-direction. In particular, response signal S1 (as a function of time t) represents a signal that can be received by a detector or detector element configured to detect a response of the structure due to interaction with beamlet 430.3. Response signal S2 (as a function of time t) represents a signal that can be received by a detector or detector element configured to detect a response of the structure due to interaction with beamlet 430.2 and response signal S3 (as a function of time t) represents a signal that can be received by a detector or detector element configured to detect a response of the structure due to interaction with beamlet 430.1. Note that, for the given lay-out of the beamlets relative to the structure and the indicated scanning direction, beamlet 430.3 will be the first beamlet to impinge on the line 420, whereas beamlet 430.1 will be last beamlet to impinge on the line. As can be seen from FIG. 4B, the angle at which the beamlet impinges on the object that is inspected affects the response signal as received. For the given example, as can be seen from signals S1 and S3, an asymmetrical signal is obtained when the beamlet impinges the structure 400 at a non-zero landing angle. This asymmetry can be used to correct the data for effects that originate in the interaction of the injected electrons by the primary beam and the material and geometry under study. As such, impinging a structure to be inspected at different angles, i.e. using beamlets that impinge on the object at different angles of incidence, provides in additional data that can be applied to more accurately determine the actual parameter or characteristic that is inspected or that is to be determined, e.g. the side wall angle SWA of a line of a grating. FIGS. 5A and 5B schematically illustrate an inspection method of a similar structure 500 as the structure 400, the structure 500 comprising a layer 510 and a line 520 having an asymmetric side wall angle on top of said layer 510. In particular, the side wall angle of the right side of the line 520 is substantially equal to zero. When such a structure 500 is scanned by the same beamlets 430.1-430.3, simulated response signals S4-S6 (solid lines) as shown in FIG. 5B can be obtained. The dotted graphs in FIG. 5B correspond to the graphs S1, S2 and S3 respectively.

The inspection method according to the present invention, whereby a sample, e.g. a semiconductor substrate, comprising a structure, is inspected using a plurality of beamlets impinging on the sample at different incident angles may also be applied to probe the depth of certain features of the structure.

Figure 6A:
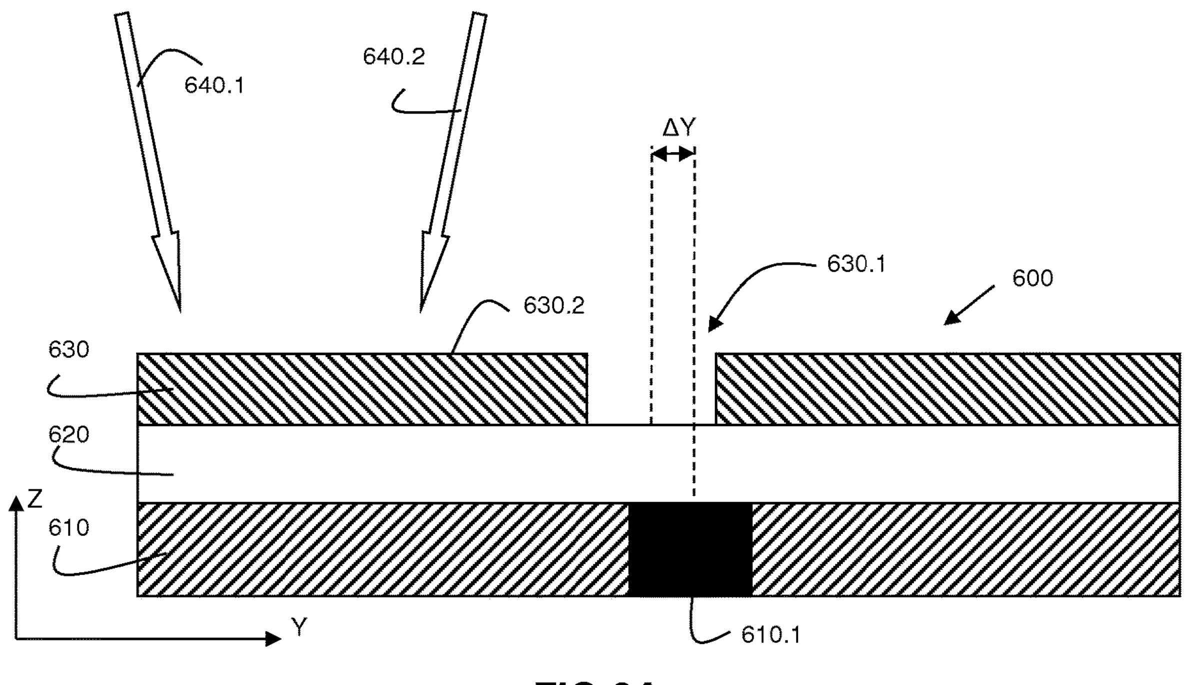
Figure 6B:
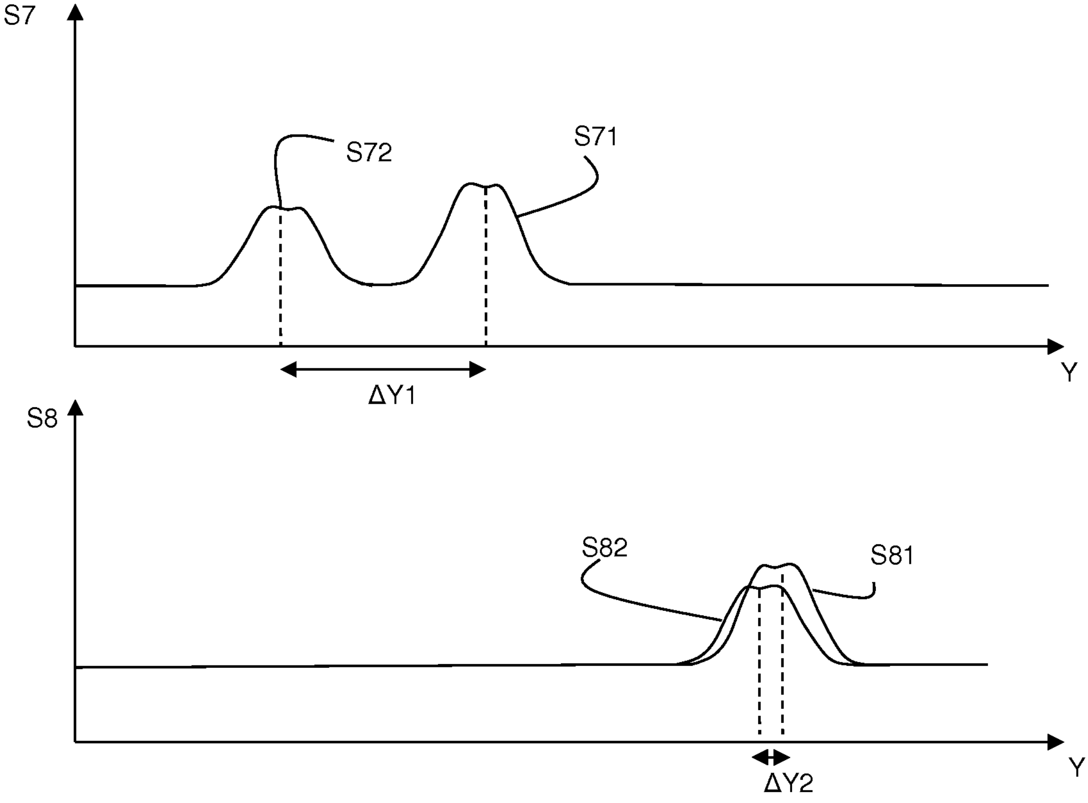

This method is schematically illustrated in FIGS. 6A and 6B.

FIG. 6A schematically shows a structure 600 comprising a buried layer 610 comprising a feature 610.1, e.g. a metal or metallic contact. The buried layer 610 is covered by a layer 620, the layer 620 is covered by a resist layer 630 comprising a through hole 630.1. such structures may e.g. be encountered in preparation of creating an aperture through the layer 620, connecting to the feature 610.1, e.g. by applying an etchant to the through hole 630.1. In case such a structure is scanned using two beamlets 640.1 and 640.2 along the Y-direction, i.e. beamlets impinging on the structure at different landing angles (e.g. +10 degrees and −10 degrees relative to the perpendicular to the surface 630.2 of the structure 600), one can obtain the response signals S8 and S7 respectively, as shown in FIG. 6B. Signal S7 thus represents the interaction of beamlet 640.2 with the sample, whereas signal S8 represent the interaction of beamlet 640.1 with the sample, when the sample and the beamlets are displaced relative to each other in the Y-direction. In the embodiment as shown, it is assumed that the beamlets have a sufficiently high energy to generate a sufficient amount of back-scattered electrodes from the feature 610.1. The signals S7 and S8 both comprise the combination of a response signal emitted by the feature 610.1, referred to as signals S71 and S81 and a response signal obtained from the interaction of the beamlets with the through hole 630.1, referred to as signals S72 and S82. Signals S72 and S82 may thus be attributed to secondary electrons that are generated when the beamlets 640.1 and 640.2 interact with the surface 630.2 and with the exposed surface of the layer 620 in the through hole 630.1. As can be seen in the graphs of S7 and S8, the difference in angle of incidence of the beamlets causes a different positional shift ΔY1 vs. ΔY2 between the signals caused by the buried feature 610.1 (signals S71 and S81) and the signals caused by the through hole 630.1 (signals S72 and S82). Based on the positional shifts ΔY1 and ΔY2 and the angles of incidence, one may then determine the depth of the feature 610.1, in particular the distance, in the Z-direction between the feature 610.1 and the through hole 630.1. It can be pointed out that this method of determining distances between two features is similar to the known parallax method used in astronomy, whereby a distance between two celestial bodies is determined by observing the bodies from different angles.

With respect to the example shown in FIGS. 6A and 6B, it can be pointed out that, in case the through hole 630.1 and the feature 610.1 would be aligned, i.e. in case the distance ΔY as shown in FIG. 6A would be zero, a measurement using a single beamlet impinging at a non-zero incident angle would be sufficient to determine the depth of the structure 610.1. (note that in such case, the temporal shift ΔT would be substantially the same for two beamlets having angles of incidence that are each others mirror images about the perpendicular to the surface (e.g. +10 degrees and −10 degrees).

In case, as shown in FIG. 6A, the distance ΔY is not equal to zero, one can determine, based on the two measurements (i.e. the measurements using the beamlets 640.1 and 640.2), the depth of the structure 610, but also the distance ΔY, representing the overlay between the through hole 630.1 and the feature 610.1.

As already indicated above, the present invention provides, in an embodiment, in an electron beam apparatus that is configured to generate a plurality of beamlets that impinge on an object at different angles of incidence. In accordance with the present invention, such a plurality of beamlets can be generated by means of a beam conversion unit comprising an aperture array and a deflector unit. Such a beam conversion unit can be embodied in various ways.

Figure 7A:
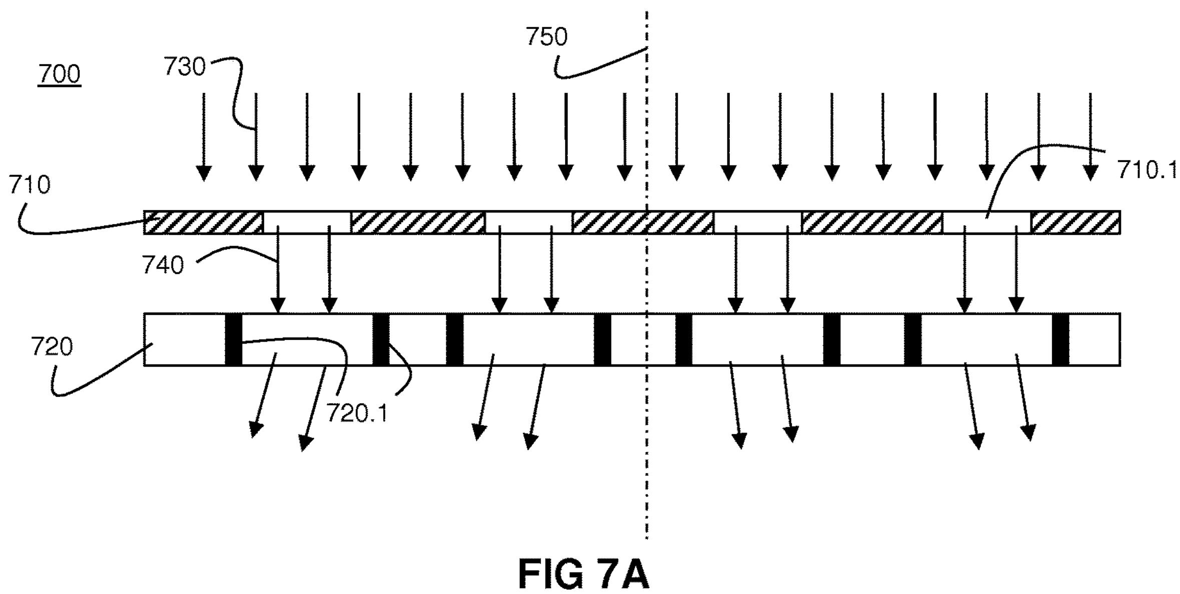
FIGS. 7A-7C illustrate a first embodiment of a beam conversion unit as can be applied in an electron beam apparatus according to the present invention.

FIG. 7A schematically shows a first embodiment of a beam conversion unit as can be applied in an electron beam apparatus according to the present invention. FIG. 7A schematically shows a cross-section side view of a beam conversion unit 700 comprising an aperture array 710 and a deflector unit 720. The aperture array 710 may be a plate shaped member comprising a plurality of apertures 710.1, e.g. circular shaped apertures, the aperture array 710 being configured to interact with an electron beam 730, whereby portions of the electron beam 730 are blocked, while other portions 740 can pass through the apertures 710.1, thus forming beamlets 740. The beamlets 740 may then propagate through the deflector unit 720. In the embodiment as shown, the deflector unit 720 comprises a plurality of electrode assemblies 720.1 comprising one or more electrodes to deflect a received beamlet. In the embodiment as shown, each aperture 710.1 of the aperture array 710 may have a corresponding electrode assembly 720.1 for deflecting the beamlet passing through the aperture. By deflecting the beamlets 740, the beamlets no longer propagate in a direction parallel to the optical axis 750 of the electron beam 730.

Figure 7B:
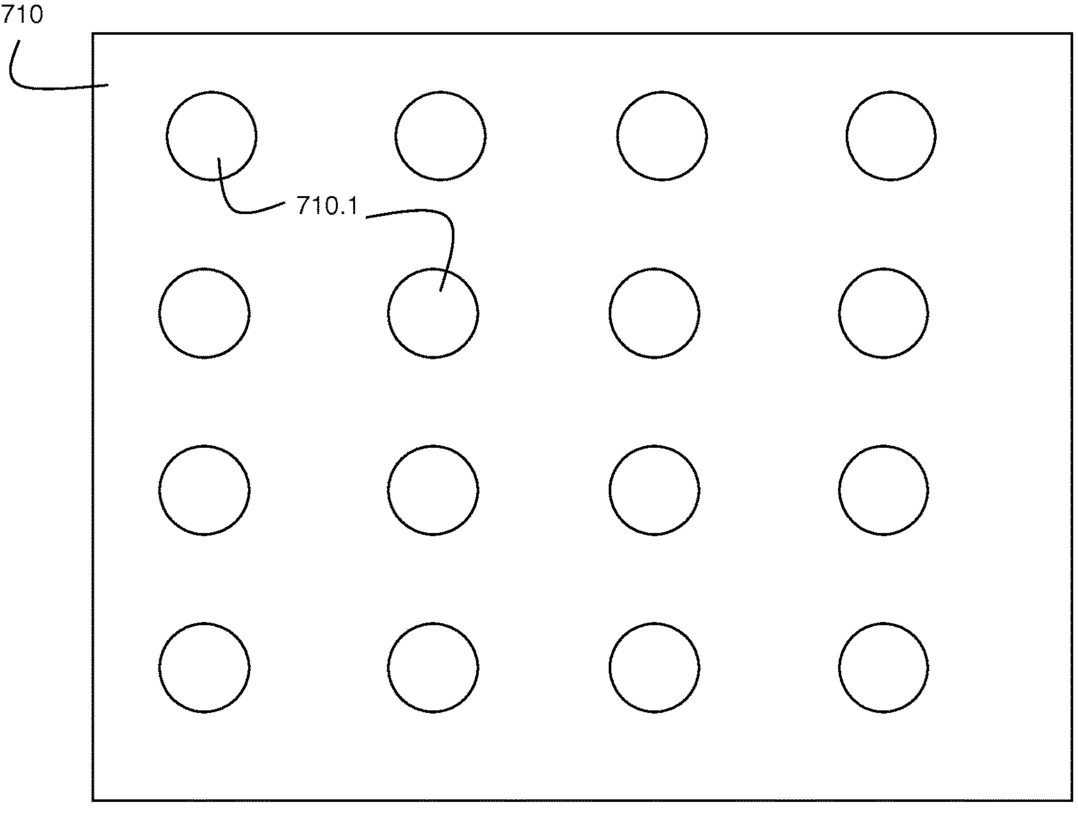
Figure 7C:
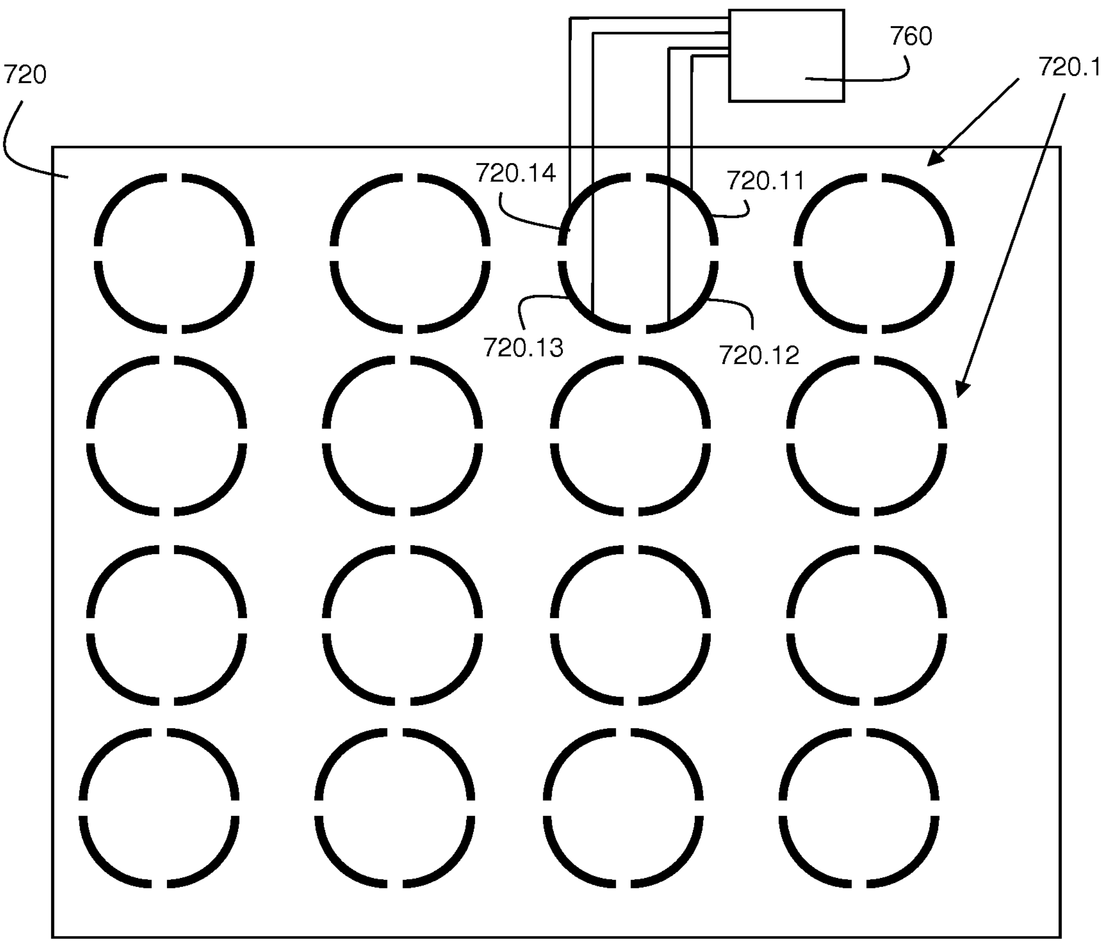

FIGS. 7B and 7C schematically depict top views of the respective aperture array 710 and the deflector unit 720 of the beam conversion unit 700 of FIG. 7A. FIG. 7B schematically shows a top view of the aperture array 710 comprising a plurality of apertures 710.1 for forming a plurality of beamlets. The generated beamlet pattern may e.g. be square or hexagonal. FIG. 7C schematically shows a top view of the deflector unit 720, the deflector unit comprising a plurality of electrode assemblies 720.1. In the embodiment as shown, each electrode assembly comprises 4 electrodes, e.g. electrodes 720.11, 720.12, 720.13 and 720.14, which can e.g. be individually connected to a voltage source 760. It should be pointed out that the use of 4 electrodes is to be considered an example, other numbers of electrodes may be applied as well, e.g. more than 4 electrodes. By controlling the voltage or voltages applied to the different electrode assemblies, one can control the deflection of each of the beamlets 740 individually and provide them with a desired angle of deflection.

It is worth mentioning that the aperture array 710 and the deflector unit 720 may be integrated into a single unit, e.g. by means of MEMS technology. In such embodiment, the beam conversion unit may be configured as a multilayer arrangement, each layer having a particular functionality. In such an arrangement, one layer may e.g. have a focusing functionality, whereas one or more other layers may e.g. have a deflector functionality. Additional layers may e.g. be applied to correct for astigmatism.

Figure 8:
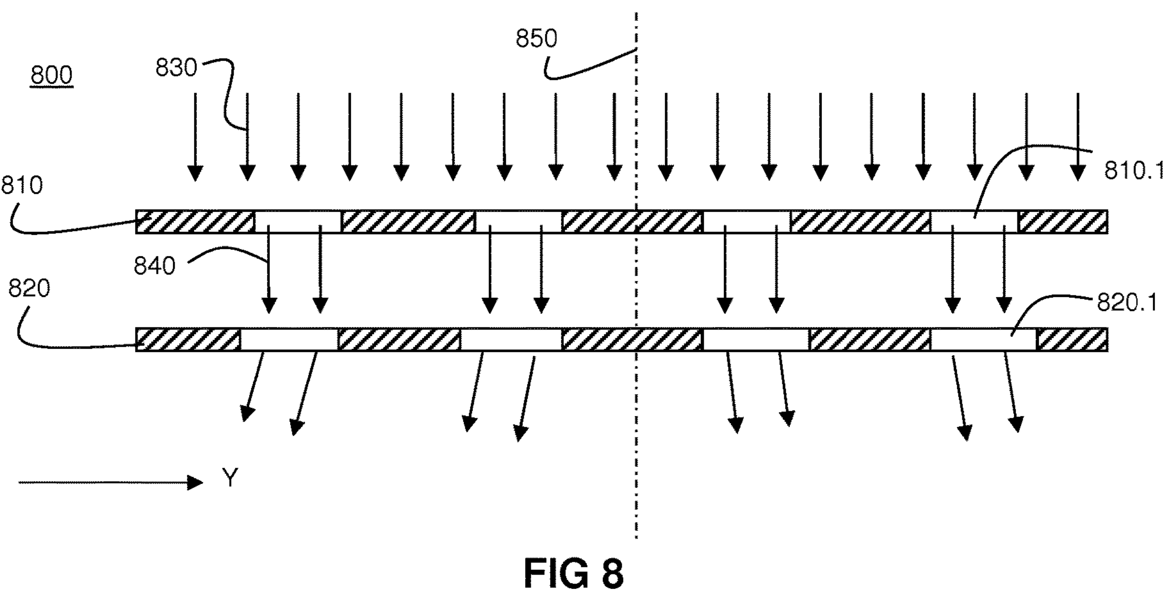
FIG. 8 depicts a second embodiment of a beam conversion unit as can be applied in the present invention.

FIG. 8 schematically depicts a cross-sectional side view of a second embodiment of a beam conversion unit 800 as can be applied in an electron beam apparatus according to the present invention. The beam conversion unit 800 as schematically shown comprises a first aperture array 810 having the same functionality as the aperture array 710 shown in FIG. 7A; i.e. it blocks part of an electron beam 830 and permits other parts of the electron beam to pass through apertures 810.1 of the aperture array so as to form beamlets 840. The beam conversion unit 800 further comprises a second aperture array comprising a plurality of apertures 820.1 that are configured to respectively receive the beamlets as generated by the apertures 810.1 of the first aperture array 810. In the embodiment as shown, the apertures 820.1 of the second aperture array 820 are shifted in the Y-direction relative to their corresponding apertures 810.1 of the first aperture array. In the embodiment as shown, the apertures 820.1 may also be slightly larger than the corresponding apertures 810.1. In this embodiment, shifting refers to the feature that the center of the apertures 820.1 is at a different distance, in the indicated Y-direction, from the optical axis 850. In such an arrangement, when the aperture arrays are supplied from a suitable voltage source, an electric field is generated which has a component in the Y-direction which causes the beamlets 840 to deflect.

In an embodiment of the present invention, a combination of the deflector units 720 and 820 can be made as well to form a deflector unit.

A third embodiment could e.g. be realized by combining an aperture array such as aperture array 810 of FIG. 8 with one comparatively large aperture, or multiple comparatively large apertures, arranged below the aperture array 810, instead of the aperture array 820. In such embodiment, the aperture array 810 can be kept at a first voltage, while the array comprising the one or multiple comparatively large apertures is kept at a second voltage, different from the first voltage. Such an arrangement will also result in a curvature in the electric field between the upper aperture array and the lower array comprising the one or multiple comparatively large apertures, such curvature causing a deflection in the Y-direction.

A fourth embodiment could e.g. be realized by applying one general deflector unit for all the beamlets that is arranged below the aperture array or arrays such that the beamlets enter the objective lens that is arranged further downstream at an angle relative to the optical axis. Such an arrangement can be used to arrange for an overall deflection angle that is common to all beamlets that is superimposed on the individual deflection angle generated by the aperture array or arrays.

Figure 9:
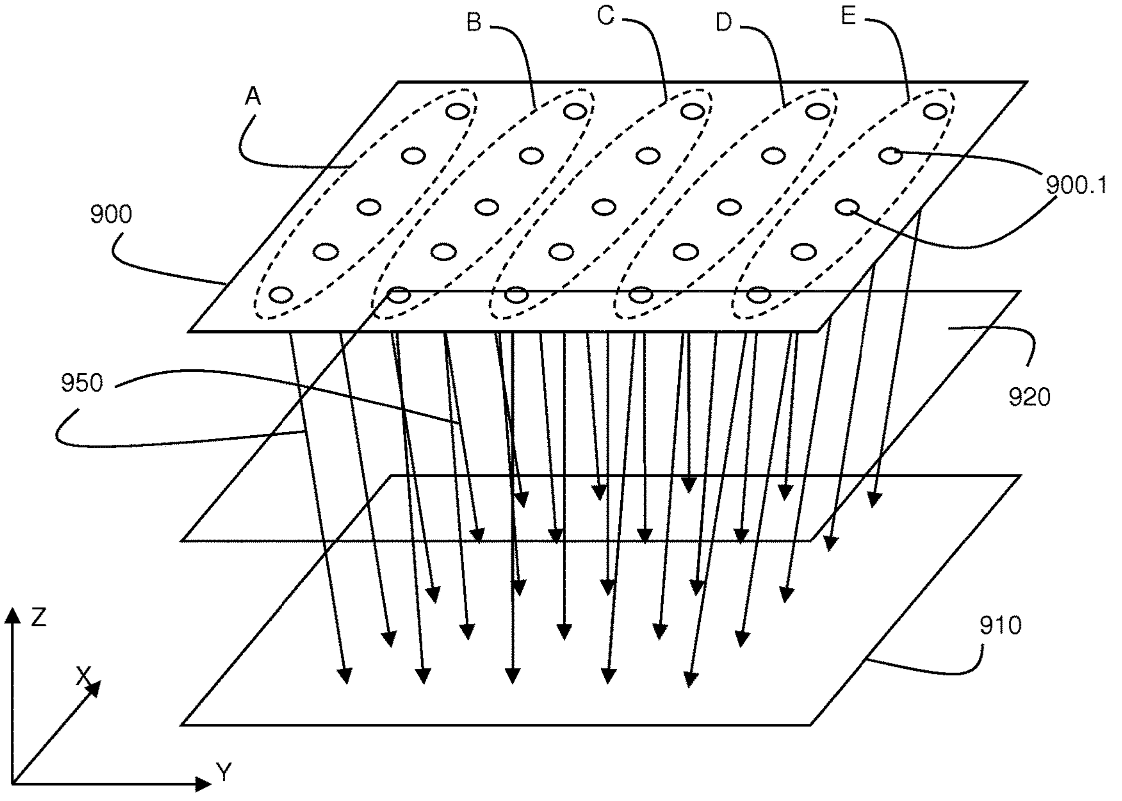
FIG. 9 depicts the generation of a plurality of beamlets using an electron beam apparatus according to the invention.

FIG. 9 schematically illustrates an arrangement of a bundle of 5×5 beamlets 950 that can be generated using an electron beam apparatus according to the present invention. In the embodiment as shown, a two-dimensional array of 5×5 beamlets is generated using a source conversion module 900 that is configured to generate the 5×5 beamlets, using a matrix of 5×5 apertures 900.1 and to deflect at least some of the beamlets. In the embodiment as shown, the generated beamlets have different angles of incidence on an object 910. In this example, the beamlets of group A have an angle of incidence of −10 degrees, the beamlets of group B have an angle of incidence of −5 degrees, the beamlets of group C have an angle of incidence of 0 degrees, the beamlets of group D have an angle of incidence of +5 degrees and the beamlets of group E have an angle of incidence of +10 degrees. As such, the beamlets arranged in a row extending in the X-direction have a substantially constant angle of incidence, whereas the beamlets arranged in a row extending in the Y-direction have different angles of incidence. The embodiment as shown further schematically illustrates an objective lens 920 that can be used to focus the beamlets 950 onto the object 910. It can be noted that such an objective lens would also change the angle of the beamlets; in particular, it can be used to enlarge the angles of the beamlets. As such, a comparatively small deflection angle generated by the aperture array may still result in comparatively large deflection angles, e.g. ~10 degrees, at the object.

The bundle of beamlets 950 as illustrated in FIG. 9 may e.g. be applied to scan, when applied in an inspection tool according to the present invention, a structure present on the object. When such a structure would e.g. comprise a line of a grating extending in the X-direction, such a line would then in sequence be probed by the sets of beamlets A-E, enabling to generate images of the structure based on beamlets or sets of beamlets impinging on the structure at different angles of incidence.

Such a bundle of beamlets 950 may, as discussed above, be obtained by converting an electron beam as generated by an electron beam source using a beam conversion unit. In general, such a beam conversion unit may be configured to convert an electron beam of an electron beam source into a plurality of beamlets, e.g. arranged in an n×n matrix.

As already indicated above, in an embodiment of the present invention, the electron beam apparatus may be configured to, using a first aperture array, subdivide an electron beam into a plurality of sub-beams. Each of these sub-beams may then, using a beam conversion unit, be converted into a bundle of beamlets. Such a bundle of beamlets as generated may also be referred to as a beamlet column. In an embodiment of the present invention, such a beamlet column may comprise its own optics components for converting the bundle, e.g. focusing or scanning.

As discussed above, the electron beam apparatus according to the present invention may advantageously be used in an inspection tool according to the present invention, thus enabling the inspection of a structure from different angles while requiring only one scanning of the structure.

The electron beam apparatus according to the present invention, may also advantageously be applied in an exposure apparatus according to the present invention, in order to pattern an object, e.g. a resist layer on a semiconductor substrate. Such an apparatus may also be referred to as a lithographic exposure apparatus. A lithographic exposure apparatus that uses a plurality of beamlets or beamlet columns to pattern an object are generally known. However, using the electron beam apparatus according to the present invention in an exposure apparatus according to the present invention, an object can be patterned using electron beams or beamlets that have different angles of incidence. It is submitted that this enables to obtain a more accurate patterning which may subsequently result in a more accurate structure deposited or generated on the object.

In an embodiment of the exposure apparatus according to the present invention, the exposure apparatus comprises an electron beam apparatus according to the present invention and a positioning device, e.g. a positioning device PW as discussed above. Such a positioning device may e.g. comprise one or more linear or planar motors for a long stroke positioning of the object relative to the plurality of beamlets generated. Such a positioning device may e.g. also comprises one or more actuator for a short stroke, more accurate positioning of the object relative to the generated beamlets.

As an alternative, the object that needs to be patterned may be kept in a substantially stationary position while the plurality of beamlets or bundles of beamlets are scanned across the object.

As such, in an embodiment of the present invention, an exposure apparatus may be configured to pattern an object by means of a plurality of beamlets having a different angle of incidence by providing in a relative displacement of the object and the beamlets in a direction perpendicular to an optical axis of the electron beam apparatus of the exposure apparatus. Such a relative displacement may, within the meaning of the present invention be referred to as scanning or a scanning process.

In order to provide the object with a particular pattern, certain portions of the object need to be exposed to one or more of the beamlets, while other portions cannot be exposed. In order to realize such a selective exposure during scanning of the object by the plurality of beamlets, one needs to be able to obscure the object or portions of the object from the beamlets.

Such a controlled obscuring of the object from one or more of the beamlets can be realized using a beamlet blanker array.

Figure 10:
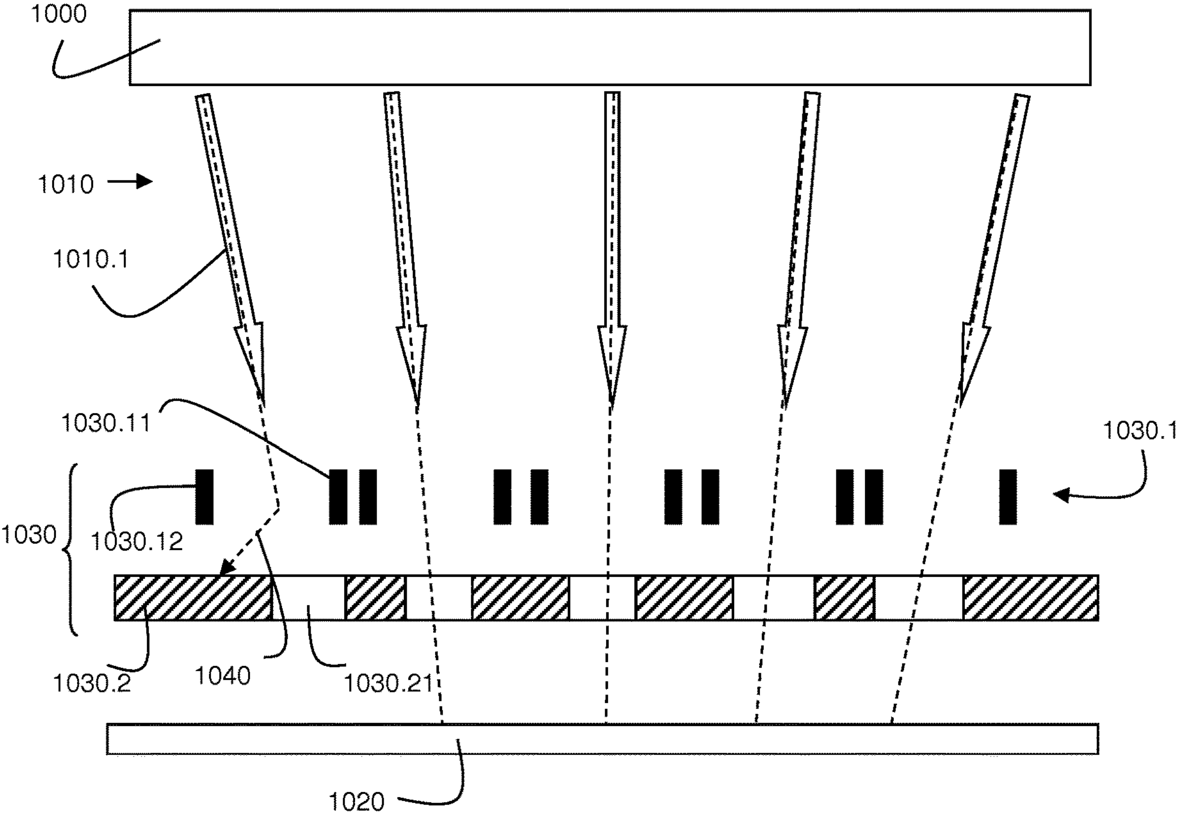
FIG. 10 depicts a beamlet blanker array as can be applied in an exposure apparatus according to the invention.

The operating principle of such beamlet blanker array is schematically shown in FIG. 10.

FIG. 10 schematically shows a beam conversion unit 1000 as can be applied in the present invention which is configured to generate a plurality of beamlets 1010 that are configured to impinge an object 1020 at different angles of incidence. The embodiment as shown in FIG. 10 further comprises a beamlet blanker array 1030 comprising an electrode array 1030.1 and an aperture array 1030.2, also referred to as a beamlet stop array 1030.2. In the embodiment as shown, the electrode array 1030.1 is configured to deflect, when supplied with the appropriate supply voltage on one or more of the deflector electrodes, one or more of the beamlets 1010, so as to land on the beamlet stop array 1030.2 rather than passing through an aperture of the aperture array 1030.2. This is illustrated in FIG. 10 for beamlet 1010.1. By providing the electrodes 1030.11 and 1030.12 with the appropriate voltage, beamlet 1010.1 can be made to deflect, indicated by the dotted arrow 1040, such that it lands on the beamlet stop array 1030.2, rather than pass through the aperture 1030.21 of the aperture array 1030.2. Seen from the object 1020, the beamlets 1010 can thus be turned 'ON' or 'OFF' by the beamlet blanker array 1030.

As such, during the scanning of an object, e.g. an object provided with a resist layer sensitive to charged particles such as electrons, individual beamlets can be turned on or off so as to selectively expose the object to one or more of the beamlets 1010, thus generating a desired pattern on the object.

It is submitted that FIG. 10 is merely intended to illustrate the principle to selectively block one or more of the beamlets, in order to generate a desired exposure pattern on an object, e.g. a semiconductor substrate. The particular layout of the different components may be different. In particular, the distance between the electrode array 1030.1 and the beamlet stop array 1030.2 may be comparatively large. In an embodiment, the electrode array 1030.1 may also be integrated in the beam conversion unit 1000.

In an embodiment, the deflection unit as described may also be used for blanking.

As will be clear to the skilled person, the inspection tool and exposure apparatus according to the present invention may comprise various other component to convert the electron beam or beamlets that are used. Such components, often referred to as optical components since they have the same functionality as in optical inspection tools or exposure apparatuses, may e.g. include projection lenses or projection lens arrays, objective lenses or objective lens arrays, or collimator lenses or collimator lens arrays, or condenser lenses or condenser lens arrays, which are known in general.

Figure 11:
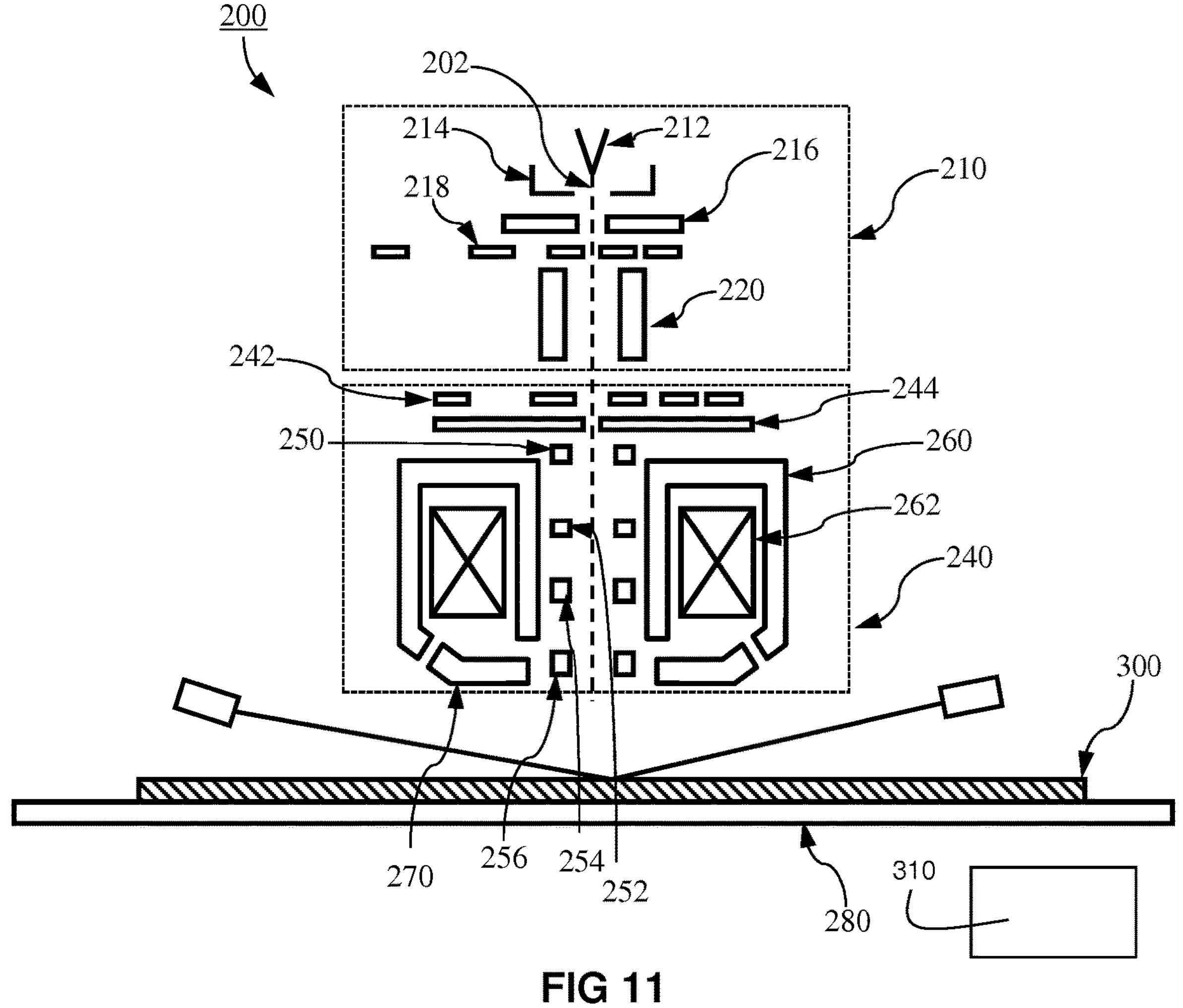
FIG. 11 schematically depicts an inspection tool as known in the art.

For completeness, a more detailed embodiment of an electron beam inspection tool as generally know which comprises such components is shown in FIG. 11.

FIG. 11 schematically depict a cross-sectional view of an known inspection tool 200 that comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter as discussed above. By the positive voltage of the anode 216, the electron beam 202 can be extracted, and the electron beam 202 may be controlled by using a selectable aperture 218 which may have different aperture sizes for eliminating the unnecessary electron beam outside of the aperture. In order to shape the electron beam 202, divergence characteristic of the condenser 220 is used on the electron beam 202, which also changes the magnification. The condenser 220 shown in the FIG. 10 may e.g. be an electrostatic lens which shapes the electron beam 202. On the other hand, the condenser 220 can be also a magnetic lens or a combined lens.

The imaging system 240 may e.g. comprise a blanker, a set of apertures 242, a detector 244, four sets of deflectors 250, 252, 254, and 256, a coil 262, a magnet yoke 260, and an electrode 270. The electrode 270 may be used to retard and deflect the electron beam 202, and may further have an electrostatic lens function. Besides, the coil 262 and the yoke 260 may be configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, so that the sample 300 is immersed in the magnetic field. On the other hand, the electrode 270 is placed beneath the opening of the yoke 260, and therefore the sample 300 will not be damaged. In order to correct a chromatic aberration of the electron beam 202, the retarder 270, the sample 300, and the yoke 260 or part thereof may form a lens to minimize the chromatic aberration of the electron beam 202. The inspection tool 200 further comprises a processing unit 310, which can e.g. be embodied as a processor, microprocessor, controller, or computer, the processing unit 310 being configured to receive a response signal from the detector or detectors, e.g. detector 244, of the inspection tool and process the response signal into an image of the scanned or examined structure or sample 300.

The embodiments may further be described using the following clauses:

1. An electron beam apparatus comprising:
 an electron beam source configured to generate an electron beam;
 a beam conversion unit comprising:
 an aperture array configured to generate a plurality of beamlets from the electron beam;
 a deflector unit configured to deflect one or more of the plurality of beamlets;
 a projection system configured to project the plurality of beamlets onto an object,
 wherein the deflector unit is configured to deflect the one or more of the plurality of beamlets to impinge on the object at different angles of incidence.
2. The electron beam apparatus according to clause 1, further comprising an object table configured to hold the object.
3. The electron beam apparatus tool according to clause 1, further comprising one or more lenses arranged upstream of the aperture array.
4. The electron beam apparatus according to any of the preceding clauses, wherein the projection system comprises an objective lens configured to project the plurality of beamlets onto the object.
5. The electron beam apparatus according to any of the preceding clauses, wherein the projection system comprises a scanning deflector unit configured to scan the plurality of beamlets across a surface of the object.
6. The electron beam apparatus according to any of the preceding clauses, wherein the deflector unit is integrated in the aperture array.
7. The electron beam apparatus according to any of the preceding clauses, wherein the deflector unit comprises a plurality of electrodes configured to deflect the respective plurality of beamlets.
8. The electron beam apparatus according to clause 6 or 7, wherein the plurality of electrodes of the deflector unit are arranged at or near the respective plurality of apertures of the aperture array.
9. The electron beam apparatus according to any of the clauses 6 to 8, wherein the beam conversion unit comprises a multilayer MEMS array comprising the aperture array and the deflector unit.
10. The electron beam apparatus according to clause 2, further comprising a positioning device for positioning the object table relative to an optical axis of the electron beam source.
11. The electron beam apparatus according to any of the preceding clauses, wherein the aperture array comprises a first aperture array configured to generate a plurality of sub-beams from the electron beam and a second aperture array configured to receive the plurality of sub-beams and to generate the plurality of beamlets.
12. The electron beam apparatus according to any of the preceding clauses, wherein the aperture array comprises a plurality of apertures for generating the respective plurality of beamlets and wherein the deflector unit comprises a further aperture array comprising a respective plurality of further apertures to receive the respective plurality of beamlets.
13. The electron beam apparatus according to clause 12 whereby the plurality of apertures and the plurality of further apertures are shifted with respect to an optical axis of the apparatus.
14. The electron beam apparatus according to clause 13, wherein the plurality of apertures are arranged in a two-dimensional array and the plurality of further apertures are arranged in a further two-dimensional array.
15. The electron beam apparatus according to clause 14, wherein a shift between a first aperture and a first further aperture associated with a first beamlet is different from a shift between a second aperture and a second further aperture associated with a second beamlet.
16. The electron beam apparatus according to any of the clauses 12 to 15, wherein, during use, the aperture array and the further aperture array are kept at a different voltage.
17. The electron beam apparatus according to any of the preceding clauses, further comprising a control unit for controlling an operation of the electron beam source and/or the beam conversion unit.

18. An inspection tool comprising an electron beam apparatus according to any of the preceding clauses.

19. The inspection tool according to clause 18, wherein the inspection tool is configured to scan the object with the plurality of beamlets.

20. The inspection tool according to clause 18, further comprising a detector configured to receive a response signal from the object in response to the scanning of the object with the plurality of beamlets.

21. The inspection tool according to clause 20, wherein the detector is configured to detect one or more of secondary electrons, backscattering electrons, X-ray radiation or electromagnetic radiation.

22. The inspection tool according to any of the clauses 19 to 21, further comprising a scanning-deflector unit for scanning the plurality of beamlets across the object.

23. The inspection tool according to any of the clauses 19 to 22, further comprising a positioning device for displacing the object relative to the plurality of beamlets, thereby scanning the plurality of beamlets across the object.

24. An exposure apparatus comprising an electron beam apparatus according to any of the clauses 1 to 17.

25. The exposure apparatus according to clause 24, wherein the exposure apparatus is configured to pattern the object using the plurality of beamlets.

26. The exposure apparatus according to clause 24 or 25, further comprising a beamlet blanker array configured to selectively block one or more of the plurality of bleamlets during the patterning of the object.

27. Method of inspecting an object, the method comprising:
- generating a plurality of beamlets from an electron beam source, the beamlets being configured to impinge the object at different angles of incidence;
- detecting a response signal from the object in response to the impinging of the object with the plurality of beamlets;
- processing the response signal to determine a characteristic of the object.

28. The method according to clause 27, wherein the object is a semiconductor substrate.

29. The method according to clause 28, wherein the object comprises a line shaped structure and wherein the characteristic comprises at least one of a line edge roughness, a line width roughness or a side wall angle.

30. The method according to clause 28, wherein the object comprises a buried structure and wherein the characteristic comprises a depth of the buried structure.

31. An electron beam apparatus comprising:
- an electron beam source configured to generate an electron beam;
- a beam conversion unit comprising:
  - an aperture array configured to generate a plurality of beamlets from the electron beam;
  - a deflector unit configured to deflect one or more groups of the plurality of beamlets;
- a projection system configured to project the plurality of beamlets onto an object, wherein the deflector unit is configured to deflect the one or more groups of the plurality of beamlets to impinge on the object at different angles of incidence, each beamlet in a group having substantially the same angle of incidence on the object 32. Method of inspecting an object, the method comprising:
- generating a plurality of beamlets from an electron beam source, one or more groups of the plurality of beamlets being configured to impinge on the object at different angles of incidence, each beamlet in a group having substantially the same angle of incidence on the object;
- detecting a response signal from the object in response to the impinging of the object with the plurality of beamlets;
- processing the response signal to determine a characteristic of the object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic, electrostatic and combined optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An electron beam apparatus comprising:

an electron beam source configured to generate an electron beam;

a beam conversion unit comprising:

an aperture array configured to generate a plurality of discrete beamlets from the electron beam, and a deflector unit configured to deflect a plurality of beamlet groups, each group having one or more beamlets selected from the plurality of discrete beamlets; and a projection system configured to project the plurality of beamlet groups onto an object, wherein the deflector unit and the projection system are together configured to deflect and cause the beamlet groups to impinge on the object such that a first net angle of incidence at the object of the electrons in each of the one or more beamlets of a first beamlet group of the plurality of beamlet groups is different than a second net angle of incidence at the object of the electrons in each of the one or more beamlets of a second beamlet group of the plurality of beamlet groups.

2. The electron beam apparatus according to claim 1, further comprising an object table configured to hold the object.

3. The electron beam apparatus according to claim 1, wherein the projection system comprises a scanning deflector unit configured to scan the plurality of beamlets across a surface of the object.

4. The electron beam apparatus according to claim 1, wherein the deflector unit is integrated in the aperture array.

5. The electron beam apparatus according to claim 1, wherein the deflector unit comprises a plurality of electrodes configured to deflect the respective plurality of beamlets.

6. The electron beam apparatus according to claim 1, wherein the aperture array comprises a plurality of apertures configured to generate the respective plurality of beamlets and wherein the deflector unit comprises a further aperture array comprising a respective plurality of further apertures to receive the respective plurality of beamlets.

7. The electron beam apparatus according to claim 6, wherein the plurality of apertures and the plurality of further apertures are shifted with respect to an optical axis of the apparatus.

8. The electron beam apparatus according to claim 7, wherein the plurality of apertures are arranged in a two-dimensional array and the plurality of further apertures are arranged in a further two-dimensional array.

9. The electron beam apparatus according to claim 8, wherein a shift between a first aperture of the plurality of apertures and a first further aperture of the plurality of further apertures associated with a first beamlet is different from a shift between a second aperture of the plurality of apertures and a second further aperture of the plurality of further apertures associated with a second beamlet.

10. The electron beam apparatus according to claim 6, wherein, during use, the aperture array and the further aperture array are kept at a different voltage.

11. The electron beam apparatus according to claim 1, further comprising a control unit configured to control an operation of the electron beam source and/or the beam conversion unit.

12. An inspection tool comprising an electron beam apparatus according to claim 1.

13. The inspection tool according to claim 12, configured to scan the object with the plurality of beamlets.

14. The inspection tool according to claim 12, further comprising a detector configured to receive a response signal from the object in response to the scanning of the object with the plurality of beamlets.

15. A method of inspecting an object, the method comprising:

generating an electron beam from an electron beam source of an electron beam apparatus;

generating a plurality of discrete beamlets from the electron beam using an aperture array of the electron beam apparatus;

deflecting a plurality of beamlet groups, each group having one or more beamlets selected from the plurality of discrete beamlets using a deflector unit of the electron beam apparatus;

projecting the plurality of beamlet groups onto the object using a projection system of the electron beam apparatus, wherein the deflector unit and the projection system together deflect and cause the beamlet groups to impinge on the object such that a first net angle of incidence at the object of the electrons in each of the one or more beamlets of a first beamlet group of the plurality of beamlet groups is different than a second net angle of incidence at the object of the electrons in each of the one or more beamlets of a second beamlet group of the plurality of beamlet groups;

detecting a response signal from the object in response to the impinging of the object with the plurality of beamlets; and processing the response signal to determine a characteristic of the object.

16. The method according to claim 15, wherein the object is a semiconductor substrate.

17. The method according to claim 16, wherein the object comprises a line shaped structure and wherein the characteristic comprises a line edge roughness, a line width roughness and/or a side wall angle.

18. The method according to claim 16, wherein the object comprises a buried structure and wherein the characteristic comprises a depth of the buried structure.

19. The method according to claim 16, further comprising scanning the plurality of beamlets across a surface of the object.

20. The method according to claim 16, wherein the deflecting comprises deflecting the respective plurality of beamlets using a further aperture array comprising a respective plurality of further apertures to receive the respective plurality of beamlets from the aperture array.

* * * * *